United States Patent
Sato et al.

[11] Patent Number: 6,156,676
[45] Date of Patent: Dec. 5, 2000

[54] LASER MARKING OF SEMICONDUCTOR WAFER SUBSTRATE WHILE INHIBITING ADHERENCE TO SUBSTRATE SURFACE OF PARTICLES GENERATED DURING LASER MARKING

[75] Inventors: Nobuyoshi Sato; Hiroshi Ohsawa; Hitoshi Hasegawa, all of Tsukuba, Japan

[73] Assignee: LSI Logic Corporation, Milpitas, Calif.

[21] Appl. No.: 09/122,335

[22] Filed: Jul. 24, 1998

[30] Foreign Application Priority Data

Jul. 31, 1997 [JP] Japan .................................... 9-206614

[51] Int. Cl.[7] ................................................. H01L 21/324
[52] U.S. Cl. ............................ 438/798; 438/228; 438/795
[58] Field of Search ................................... 438/798, 228, 438/795; 219/638

[56] References Cited

U.S. PATENT DOCUMENTS 3,742,183   6/1973   Castor et al. ............................ 219/121
5,543,365   8/1996   Wills et al. ............................. 437/226
5,610,104   3/1997   Mitchell ................................. 437/228

FOREIGN PATENT DOCUMENTS 63-183885   7/1988   Japan .
8-45801     2/1996   Japan .

*Primary Examiner*—Matthew Smith
*Assistant Examiner*—Granvill Lee
*Attorney, Agent, or Firm*—John P. Taylor

[57] ABSTRACT

The present invention provides apparatus and a process for efficiently removing particles generated during a laser marking of the semiconductor wafer substrate, thereby improving the yield. The process of the invention for marking a semiconductor wafer substrate by a beam of laser radiation comprises the steps of flowing a gas over a marking region at a predetermined flow rate and removing the gas from the marking region at the same predetermined flow rate, thereby generating a gas flow having a predetermined flow rate over and adjacent the marking region so that particles produced from the semiconductor wafer substrate while it is being marked will be removed. In a preferred embodiment, the semiconductor wafer substrate may be mounted with its upper surface to be marked directed downwardly while the laser marking beam is directed upwardly to the substrate.

7 Claims, 6 Drawing Sheets

LASER MARKING OF SEMICONDUCTOR WAFER SUBSTRATE WHILE INHIBITING ADHERENCE TO SUBSTRATE SURFACE OF PARTICLES GENERATED DURING LASER MARKING

BACKGROUND OF THE INVENTION

1. Field of the Invention

The present invention relates to a marking method and apparatus for a semiconductor wafer substrate, or for a glass substrate used for a liquid crystal display.

2. Description of the Related Art

In manufacturing a semiconductor device, one or more marks are conventionally formed on the silicon wafer used as the substrate of the semiconductor device by means of laser radiation for the purpose of product identification. This process is usually called laser marking. More particularly, the surface of the wafer is partially melted on a portion where a mark is desired to be made, in this prior art laser marking process, by a beam of laser radiation such as a Nd-YAG laser, so that an uneven surface is formed which can be identified by the naked eye.

When such marks are thus physically formed, the silicon melted from the wafer by the laser radiation is scattered into the neighborhood of the marking region. Some scattered silicon particles will fall onto and adhere to the wafer surface and thereby cool and harden on the surface, while other particles may cool and harden in the atmosphere and subsequently fall onto the wafer surface. As the dimensions of semiconductor devices decrease, decreased yield of integrated circuit chips from the semiconductor wafer substrate, due to such particles becomes a serious problem. In particular, particles adhering to and hardening on the wafer surface, as described above, have become the main reason for decreased yield of integrated circuit chips from the semiconductor wafer substrate because it is difficult for such particles, which are relatively large and securely fixed onto the wafer surface, to be removed in the subsequent cleaning process.

Prior art FIGS. 4A and 4B show a prior art laser marking system wherein a beam of laser radiation 7 from a laser source 1 is directed via mirror 8 onto the surface of a semiconductor wafer substrate 2 mounted on a substrate support 3. A vacuum pump or gas absorber 4 having an inlet port 6 is shown mounted adjacent substrate 2 to remove any gases 5 which may be in the chamber in which substrate 2 is mounted. Particles 9 are shown being generated by laser beam 7 as it marks substrate 2. In this prior art processing procedure, most of particles 9 generated during the laser marking process will continue to stay on the wafer. In one instance, the number of particles and the yield of chips from the wafer substrate were tabulated. Thirty-five (35) particles were found on the laser-marked wafer substrate, and the yield of chips from the laser marked substrate was 60%.

In order to obviate and solve this problem, a new marking method is proposed in Japanese Patent Laid-Open Application No. 183885/1988, wherein, as shown in prior art FIGS. 5A–5C (corresponding to FIG. 2 of this laid-open application), a photoresist layer 12 is initially formed on the surface of semiconductor wafer substrate 2. Laser radiation is then directed toward the surface of substrate 2 covered with photoresist layer 12 to provide a marking 14 on substrate 2, as shown in FIGS. 5B and 5C. By employing this method, particles 9 generated due to the laser marking will fall onto, and adhere to, photoresist layer 12, so that they can be readily removed together with photoresist layer 12 when photoresist layer 12 is removed after the marking process.

In Japanese Patent Laid-Open Application No. 45801/1996, a similar method for removing particles is described, wherein an oxide layer 13 is used as shown in prior art FIGS. 6A–6D rather than photoresist layer 12 shown in the above case.

These prior art marking methods will, though slightly modified as proposed in the above-referred patent applications, also result in decrease in the yield of integrated circuit chips from the semiconductor wafer substrate because the laser radiation also causes the photoresist or oxide layer to be scattered. Further, the particles generated from the wafer substrate when the laser radiation reaches the substrate may, when dropped on the photoresist or oxide layer, melt the photoresist or oxide layer and thereby reach the underlying substrate and become securely bonded thereto, as shown in prior art FIG. 6D, and thus cannot easily be removed during subsequent cleaning.

It would be desirable to provide a marking method and apparatus by which the particles generated during the laser marking process will be inhibited from adhering to the semiconductor wafer substrate causing less particles to adhere to the wafer substrate, thereby increasing the yield of integrated circuit chips from the semiconductor wafer substrate.

SUMMARY OF THE INVENTION

The present invention comprises a method for physically removing particles generated by laser radiation directed at a semiconductor wafer substrate whereby the particles are removed by a gas flow directed over the surface of the semiconductor wafer substrate or wherein the upper surface of the wafer substrate on which the marks are formed faces downward and the laser is radiated upward toward the wafer so that the particles will fall away from the wafer under gravity.

In accordance with one embodiment of the present invention, a method for removing particles generated while marking a semiconductor wafer substrate using laser radiation comprises the steps of: flowing a gas over a marking region on a semiconductor wafer substrate at a predetermined flow rate during the marking of the region with laser radiation, and removing the gas from the marking region at the same predetermined flow rate, thereby generating a gas flow having the predetermined flow rate over and adjacent the marking region so that particles produced from the semiconductor wafer substrate while being marked with the laser radiation will be removed.

In accordance with another embodiment of the invention, in the laser marking method above, the semiconductor wafer substrate is mounted with its surface being marked facing downward and the laser radiation is directed upward to the surface of the substrate being marked In accordance with another embodiment of the invention, a method is provided for removing particles generated while marking a semiconductor wafer substrate using laser radiation wherein the semiconductor wafer substrate is mounted with its surface being marked facing downward and the laser radiation is directed upward to the surface of the substrate being marked. In this embodiment, no gas flow is used and particles are simply allowed to fall freely.

In accordance with another embodiment of the invention, an apparatus for marking a semiconductor wafer substrate by directing laser radiation thereon, comprises: apparatus for directing laser radiation onto a surface of the substrate; apparatus for flowing a gas over the region on the substrate surface being marked at a predetermined flow rate; and apparatus for removing the gas from the marking region at the same predetermined flow rate; thereby generating a gas flow having a predetermined flow rate over the region of the substrate surface being marked so that particles produced from the semiconductor wafer substrate while being marked will be removed. In this embodiment, apparatus may be provided for mounting the semiconductor wafer substrate with its surface being marked facing downward and for directing the laser radiation upward to the substrate surface.

For the above method and apparatus, the gas used may be nitrogen or oxygen.

DETAILED DESCRIPTION OF THE INVENTION

The embodiments of the invention will now be described by referring to FIGS. 1A–1B, 2A–2B, and 3A–3B of the drawings.

Figure 1A:
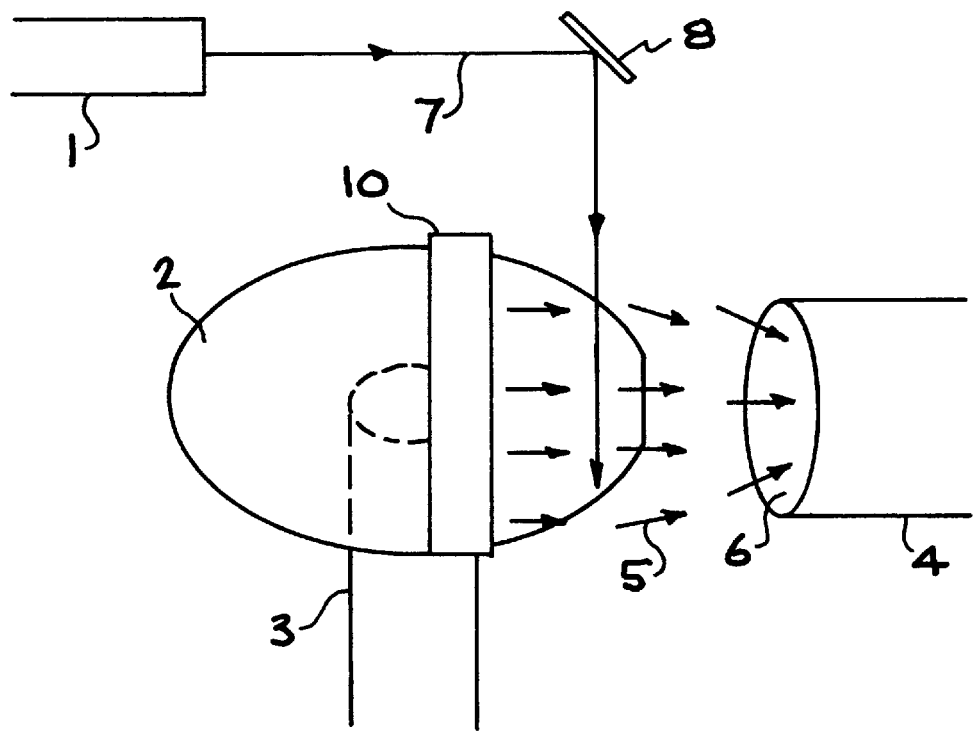
FIG. 1A is a perspective view of one embodiment of the laser marker system of the invention.
Figure 1B:
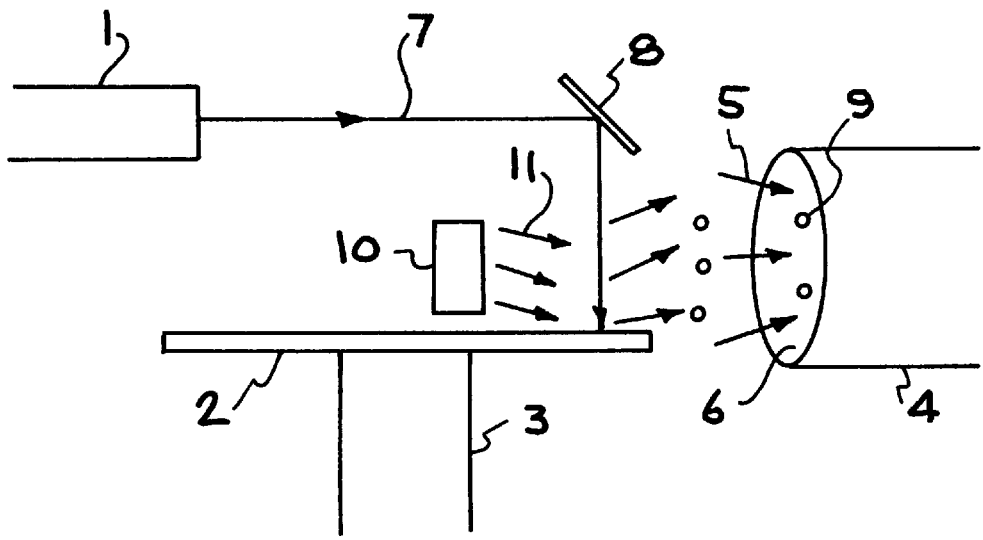
FIG. 1B is a fragmentary vertical cross-sectional view of the laser marker system of FIG. 1A.

A laser marking apparatus, in accordance with one embodiment of the invention, is schematically illustrated in the perspective view of FIG. 1A and the front view of FIG. 1B. Particles 9, generated from wafer substrate 2 when it is radiated by laser radiation beam 7 from laser source 1, will be physically removed by gas 11 flowing from sweeping gas blower 10 and vacuumed together with the gas 5 flowing through input port 6 into vacuum pump or gas absorber 4 and thereby removed from the chamber, as shown in FIG. 1B. The flow rate of the sweeping gas 11 being blown into the chamber across the surface of substrate by gas blower 10 is identical with that of the gas 5 vacuumed into input port 6 of gas absorber 4 so that the flow of sweeping gas 11 entering the chamber will be well balanced with the flow of particle-ladened gas 5 being removed.

Experimental results are given below in Tables 1 and 2 which show the relationship between the flow rate of the gas, the number of particles remaining on the semiconductor wafer substrate after the laser marking, and the yield of the manufactured semiconductor devices from the marked and treated semiconductor wafer substrates when nitrogen gas ($N_2$) (Table 1) and oxygen ($O_2$) (Table 2) are respectively used as the gas flowing through the chamber to sweep the particles from the chamber and prevent them from settling on and adhering to the substrate.

TABLE 1

| Flow Rate of $N_2$ (liter/min.) | Number of Particles (>0.3 μm) | Yield (%) |
|---|---|---|
| 10 | 20 | 80 |
| 30 | 10 | 90 |
| 50 | 0 | 95 |
| 70 | 0 | 95 |
| 100 | 0 | 95 |

TABLE 2

| Flow Rate of $O_2$ (liter/min.) | Number of Particles (>0.3 μm) | Yield (%) |
|---|---|---|
| 10 | 20 | 80 |
| 30 | 5 | 90 |
| 50 | 0 | 95 |
| 70 | 0 | 95 |
| 100 | 0 | 95 |

Figure 2A:
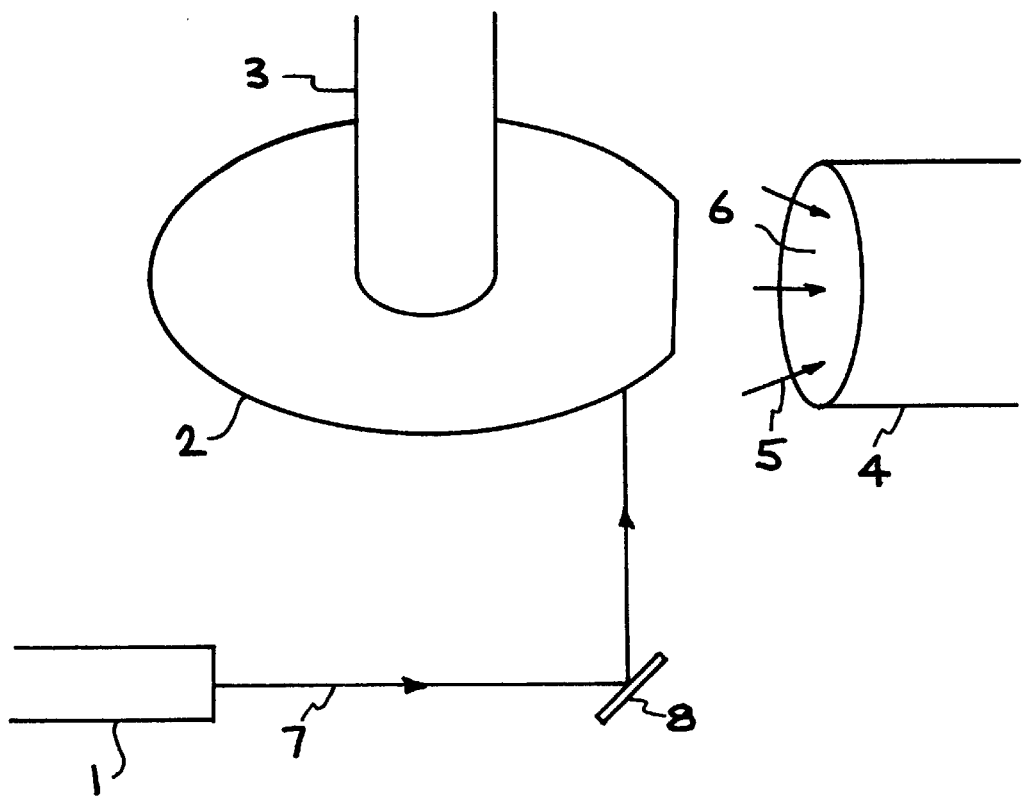
FIG. 2A is a perspective view of another embodiment of the laser marker system of the invention.
Figure 2B:
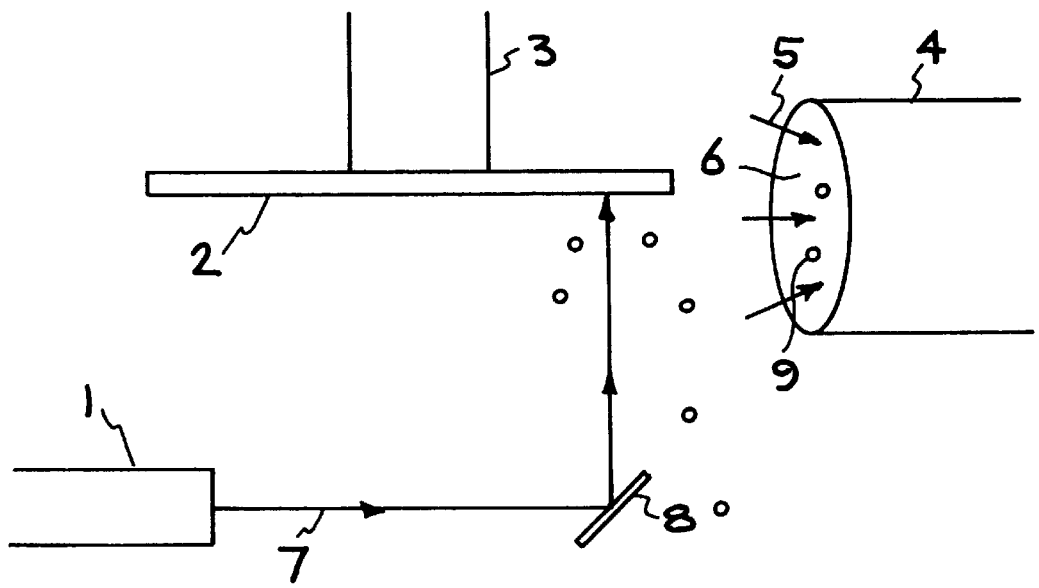
FIG. 2B is a fragmentary vertical cross-sectional view of the laser marker system of FIG. 2A.

A laser marker apparatus and process in accordance with another embodiment of the invention is schematically illustrated in the perspective view of FIG. 2A and the vertical cross-sectional view of FIG. 2B. In this embodiment, wafer substrate 2 is secured to substrate support 3 by a vacuum chuck (not shown) with the surface of substrate 2 to be marked facing downward, i.e., in a "face-down" manner. In this embodiment, laser radiation source 1 is mounted below substrate 2 and radiation beam 7 for the marking is directed upward by mirror 8 to radiate the downwardly facing surface of wafer substrate 2. As in the embodiment shown in FIGS. 1A and 1B, a vacuum pump or gas absorber 4 is provided adjacent substrate 2. In this configuration, particles 9 generated by radiation of wafer substrate 2 by laser radiation beam 7 will freely fall downward (by gravity) or be absorbed into absorber 4 and removed from the chamber. An experiment has shown that when practicing this embodiment of the invention, only five (5) particles remained on wafer substrate 2 after the laser marking process of the invention, and the percentage yield of semiconductor devices (chips) made from the marked semiconductor wafer substrate was 90%, a very good result.

Figure 3A:
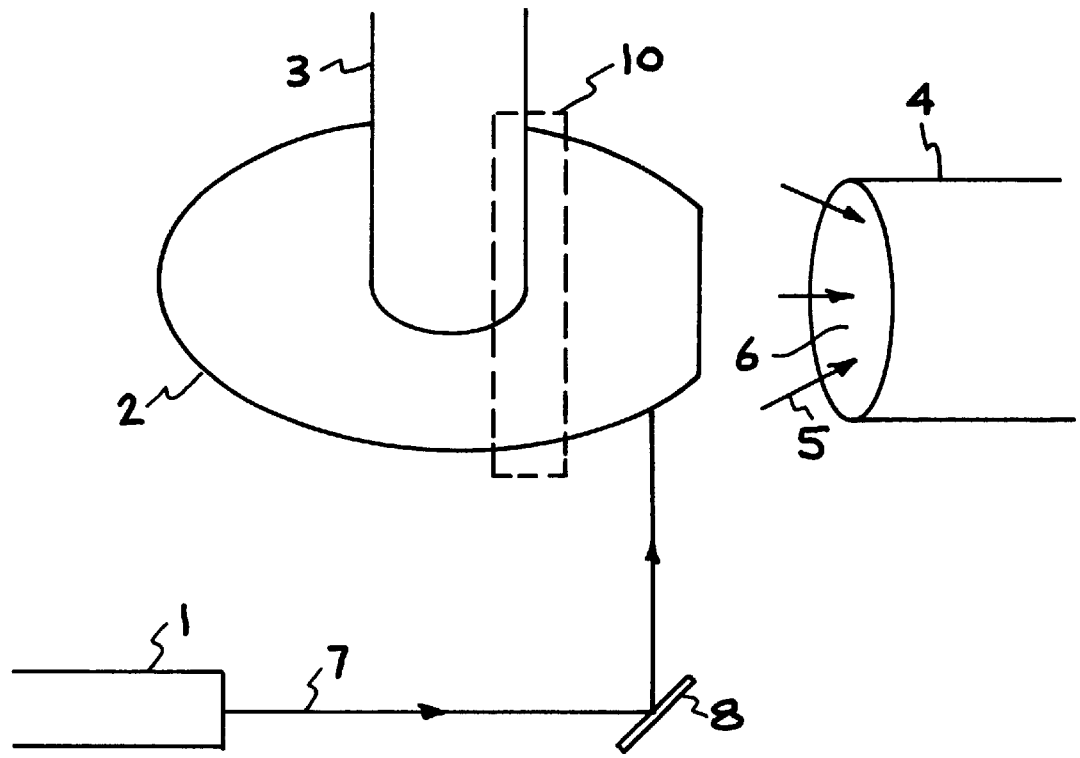
FIG. 3A is a perspective view of still another embodiment of the laser marker system of the invention.
Figure 3B:
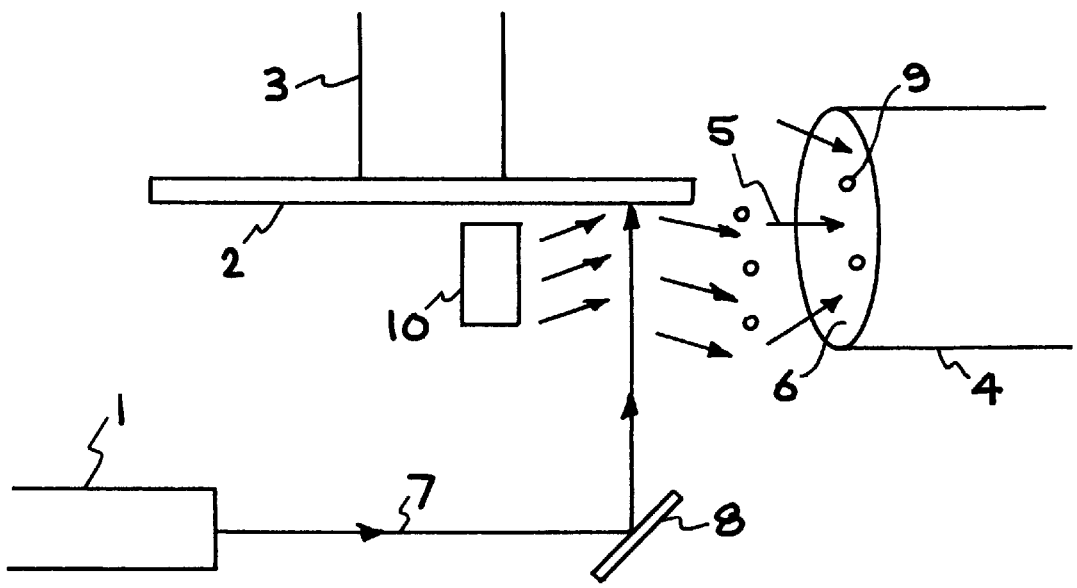
FIG. 3B is a fragmentary vertical cross-sectional view of the laser marker system of FIG. 3A.

In accordance with still another embodiment of the invention, a laser marker process, resulting from the combining of the above two configurations, is schematically illustrated in the perspective view of FIG. 3A and the vertical cross-sectional view of FIG. 3B. As illustrated, substrate 2 is again mounted on substrate support 3 so that the surface to be marked by the laser is facing downwardly, and laser source 1 and mirror 8 are again positioned to provide an upwardly-directed laser radiation beam 7. However, in this embodiment, a gas flow is also provided from sweeping gas blower 10 to the region of substrate 2 being marked by laser beam 7 so that the gas flow, which includes physically blown off particles 9, will be vacuumed into input 6 of gas absorber or vacuum pump 4, as shown at 5, and removed. As in the first embodiment, the flow rate of the sweeping gas entering the chamber from gas source 10 is identical with that of the flow of gas being removed by vacuum pump 4 so that a good balance is maintained between the inlet and outlet gas flows.

Table 3 shows experimental results for this third embodiment which shows the relationship between the flow rate of the gas and the number of particles remaining on the substrate after the laser marking, and the yield of the manufactured semiconductor devices (integrated circuit chips) when nitrogen gas ($N_2$) is used for the gas flow. The top row of this table shows the result of the case where the gas flow is zero, that is, when no gas flow is provided as in the embodiment of FIGS. 2A and 2B. In this case, the number of particles remaining after the laser marking is five, and the yield of chips from the substrate is 90%.

TABLE 3

| Flow Rate of $N_2$ (liter/min.) | Number of Particles (>0.3 µm) | Yield (%) |
|---|---|---|
| 0 | 5 | 90 |
| 10 | 1 | 92 |
| 20 | 0 | 95 |
| 30 | 0 | 95 |

As might be expected, when the experimental results shown in Table 3 are compared with those of Tables 1 and 2, better yields are achieved even with less gas flows due to the fact that the laser radiation is directed upward and the substrate surface to be marked is facing downward.

Figure 4A:
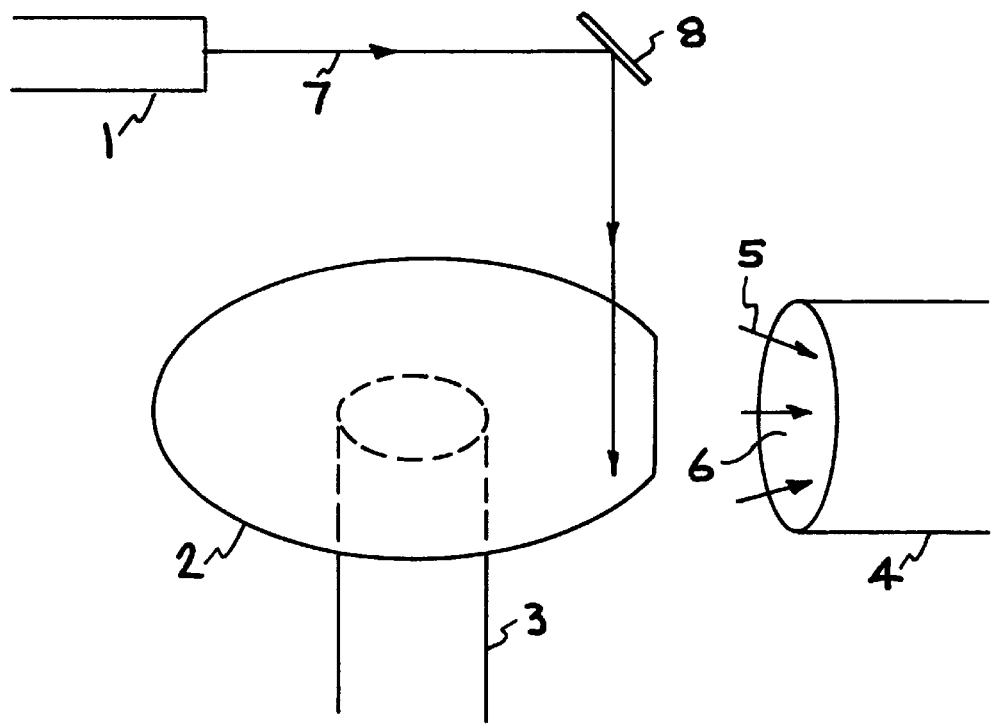
FIG. 4A is a perspective view of a prior art laser marker system.
Figure 4B:
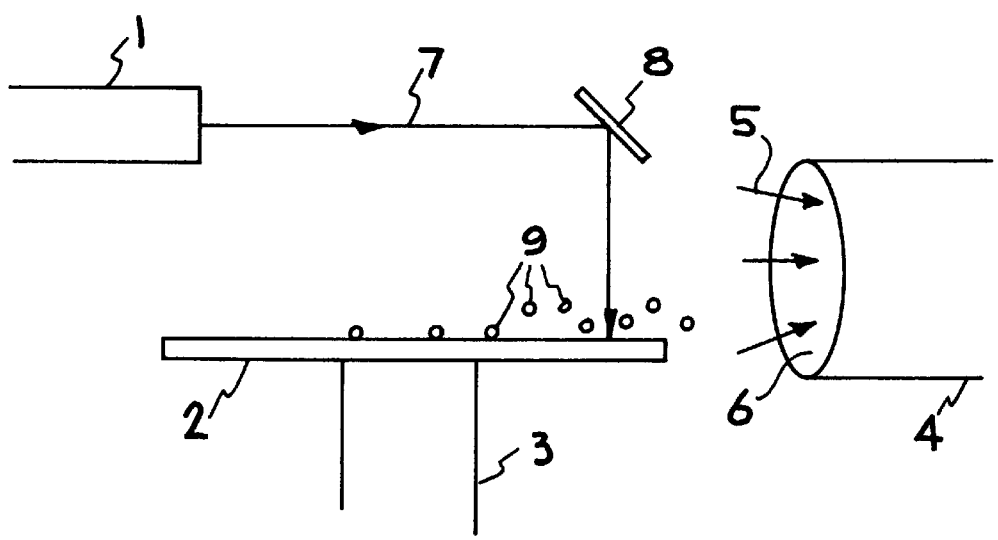
FIG. 4B is a fragmentary vertical cross-sectional view of the prior art system of FIG. 4A.
Figure 5A:
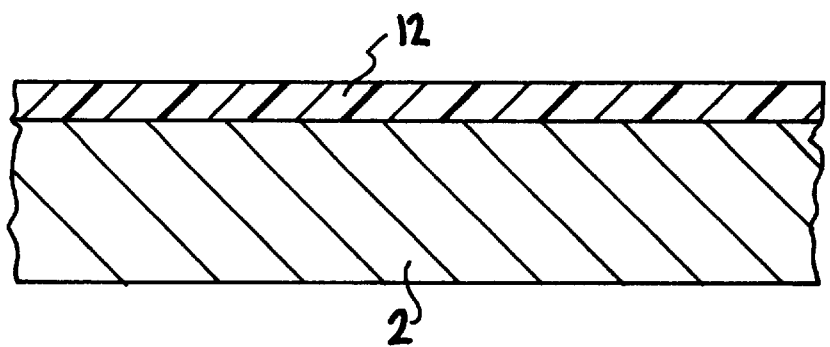
FIG. 5A is a fragmentary vertical cross-sectional view of a prior art wafer showing the condition after a photoresist layer is coated on the wafer.
Figure 5B:
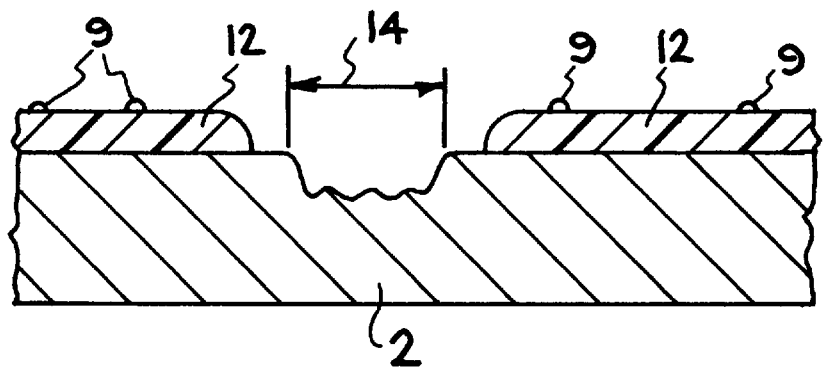
FIG. 5B is a fragmentary vertical cross-sectional view of the prior art wafer of FIG. 5A. showing the condition of the wafer and photoresist layer thereon after a prior art laser marking process has been conducted.
Figure 5C:
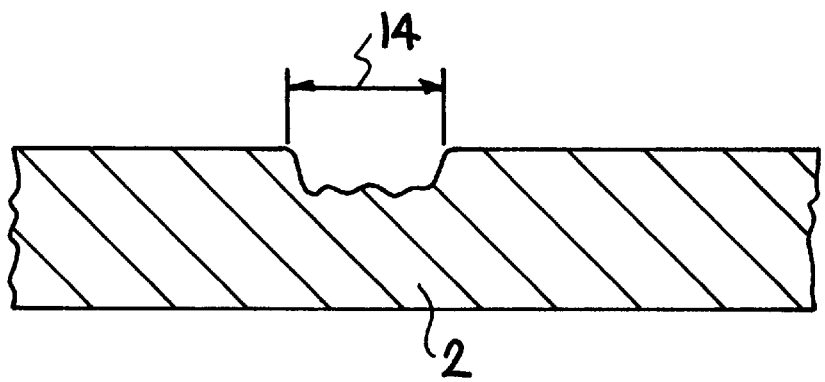
FIG. 5C is a fragmentary vertical cross-sectional view of the prior art wafer of FIG. 5B showing the condition after the photoresist layer is removed.
Figure 6A:
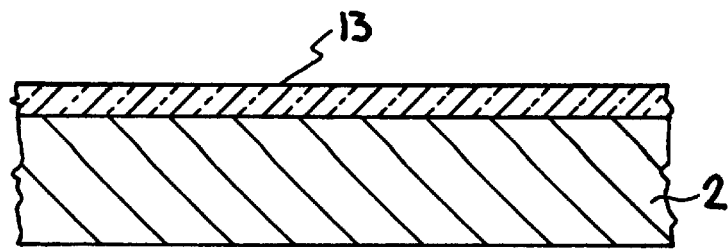
FIG. 6A is a fragmentary vertical cross-sectional view of a prior art wafer showing the condition of the wafer after an oxide layer is coated on the wafer.
Figure 6B:
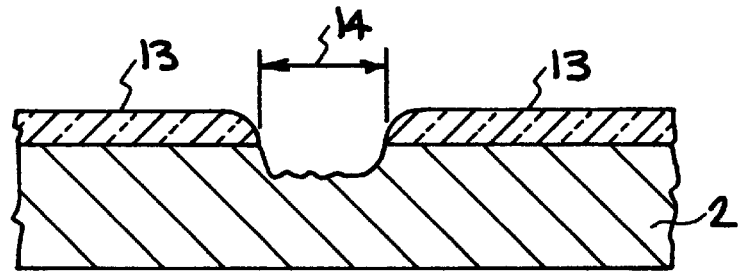
FIG. 6B is a fragmentary vertical cross-sectional view of the prior art wafer of FIG. 6A showing the condition of the wafer and oxide thereon after a prior art laser marking process has been conducted.
Figure 6C:
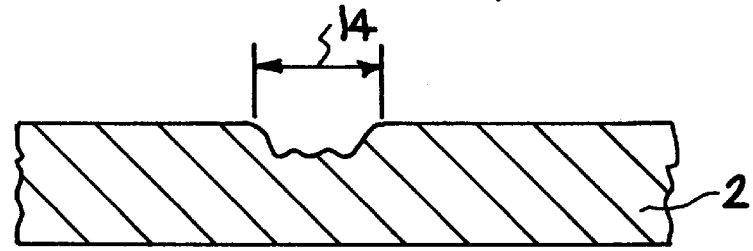
FIG. 6C is a fragmentary vertical cross-sectional view of the prior art wafer of FIG. 6B showing the condition after an HF etch is performed to remove the oxide layer.
Figure 6D:
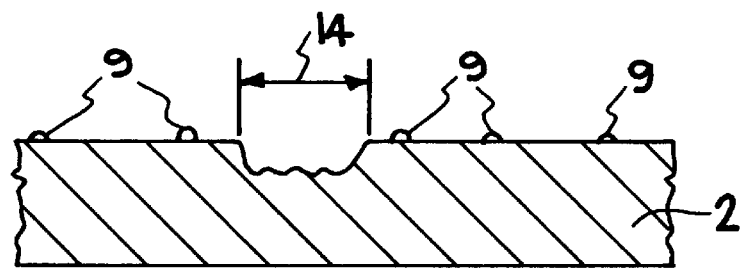
FIG. 6D is a fragmentary vertical cross-sectional view of the prior art wafer of FIG. 6C showing particles remaining on the wafer after removal of the oxide layer thereon.

As previously stated with respect to the prior art apparatus and process shown in FIGS. 4A and 4B, if no gas flow is provided across the surface of the substrate during the laser marking, and if the laser radiation is directed downward instead of upward, most of the particles generated during the laser marking process will continue to stay on the wafer. When a comparative experiment was conducted without using either the gas flow of the invention nor the downward mounting of the substrate surface to be marked with the laser beam of the invention, the number of particles on the same size substrate was found to be thirty-five (35) and the yield of chips from the substrate was only 60%, which result is significantly worse than when the present invention is employed.

In accordance with the invention, it is possible, as has been described thus far, to decrease the number of particles that would otherwise continue to remain on the wafer substrate after laser marking of the substrate by supplying a gas flow comprising pure gas to the region of the substrate surface being marked and simultaneously vacuuming the gas into an absorber or vacuum pump together with the particles generated by the laser marking process. As shown in Tables 1 and 2, when a gas flow, over the surface region of the substrate being marked with the laser beam, of at least 50 liter/minute is used, the number of particles remaining on the substrate, after the laser marking process, may be decreased down to zero, and the yield may be increased from the prior art level of 60% (as discussed with respect to prior art FIG. 4) up to 95% (third column of Table 1 or Table 2).

If the embodiment is employed wherein the wafer substrate is fixed with its upper surface being marked facing downwardly so that the particles are allowed to freely fall down away from the wafer, and at least 20 liter/minute of gas flow is provided over the downwardly facing region of the substrate surface being marked with the laser beam, the number of particles remaining on the substrate surface after the laser marking step may be decreased down to zero and the yield may be increased to 95% (third column of Table 3).

Thus, the invention provides a process and apparatus for reducing particle retention on the surface of a semiconductor wafer substrate being marked with a laser beam by either simultaneously flowing a sweeping gas over the substrate surface during the laser beam marking of the substrate and removing the gas from the chamber at the same rate, or by mounting the laser beam source, and the substrate to be marked, so that the laser beam is directed upwardly toward a downwardly facing substrate surface to be marked by the laser beam, or by combining both the gas flow embodiment and the downwardly facing substrate surface embodiment together.

Having thus described the invention what is claimed is:

1. In a process for marking a semiconductor wafer substrate by directing a beam of laser radiation onto a surface of said substrate, the improvement which comprises:
    a) mounting said semiconductor wafer substrate with its surface to be marked by said beam of laser radiation facing a source of laser radiation;
    b) directing a beam of laser radiation from said source of laser radiation toward a region of a surface of a semiconductor wafer substrate to mark said substrate;
    c) flowing a gas at a predetermined flow rate over said region of said substrate surface being marked by said beam of laser radiation; and
    d) removing said gas from said region at the same predetermined flow rate; thereby generating a gas flow of said predetermined flow rate over said region of said substrate surface being marked so that particles generated from said semiconductor wafer substrate by said beam of laser radiation during said marking of said semiconductor wafer substrate will be removed by said gas.

2. The process of claim 1 including the further steps of mounting said substrate with said substrate surface facing downward, and directing said beam of laser radiation upwardly toward said substrate surface during said marking of said substrate with said beam of laser radiation.

3. The process of claim 1 wherein said gas comprises nitrogen.

4. The process according to claim 1 wherein said gas comprises oxygen.

5. In a process for marking a semiconductor wafer substrate by directing a beam of laser radiation onto a surface of said substrate, the improvement which comprises:
    a) mounting said semiconductor wafer substrate with its surface to be marked with said beam of laser radiation facing downwardly;
    b) mounting a source of laser radiation below said semiconductor substrate surface;
    c) directing a beam of laser radiation toward said downwardly facing surface of said semiconductor wafer substrate to mark said substrate;
    d) flowing a gas at a predetermined flow rate over said substrate surface being marked by said laser radiation; and e) removing said gas from said substrate surface at the same predetermined flow rate; thereby generating a gas flow of said predetermined flow rate over said substrate surface being marked so that particles generated from said semiconductor wafer substrate by said laser radiation during said marking of said semiconductor wafer substrate will be removed by said gas.

6. The process of claim 5 wherein said gas comprises nitrogen.

7. The process according to claim 5 wherein said gas comprises oxygen.

* * * * *